(12) United States Patent
Suzuki et al.

(10) Patent No.: US 7,539,464 B2
(45) Date of Patent: *May 26, 2009

(54) POWER SERIES TYPE PREDISTORTER FOR MULTI-FREQUENCY BANDS OPERATION

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 411 days.

This patent is subject to a terminal disclaimer.

(21) Appl. No.: 11/446,381

(22) Filed: Jun. 5, 2006

(65) Prior Publication Data

US 2006/0276147 A1     Dec. 7, 2006

(30) Foreign Application Priority Data

Jun. 6, 2005   (JP)   ............................. 2005-166059

(51) Int. Cl.
*H04B 1/04* (2006.01)
(52) U.S. Cl. .................................... 455/114.3; 375/296
(58) Field of Classification Search .............. 455/114.2, 455/114.3; 330/149; 375/296, 297
See application file for complete search history.

(56) References Cited

U.S. PATENT DOCUMENTS

| 4,329,655 | A | 5/1982 | Nojima et al. |
| 4,811,422 | A | 3/1989 | Kahn |
| 5,132,639 | A | 7/1992 | Blauvelt et al. |
| 6,944,469 | B2 * | 9/2005 | Jo et al. ........................ 455/522 |
| 7,170,344 | B2 * | 1/2007 | Suzuki et al. ................ 330/149 |
| 2005/0162225 | A1 | 7/2005 | Suzuki et al. |
| 2005/0168283 | A1 | 8/2005 | Suzuki et al. |
| 2005/0180527 | A1 | 8/2005 | Suzuki et al. |
| 2005/0189990 | A1 | 9/2005 | Mizuta et al. |

(Continued)

FOREIGN PATENT DOCUMENTS

GB   2 335 812 A   9/1999

(Continued)

OTHER PUBLICATIONS

Henry Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

(Continued)

*Primary Examiner*—Nguyen Vo
(74) *Attorney, Agent, or Firm*—Oblon, Spivak, McClelland, Maier & Neustadt, P.C.

(57) ABSTRACT

A power series type predistorter for multi-frequency bands includes a linear transmission path $P_L$ provided with a delay element 5 and distortion generating paths $P_{D1}$ and $P_{D2}$ for a plurality of frequency bands in parallel; wherein each of the distortion generating paths $P_{D1}$ and $P_{D2}$ for a plurality of frequency bands includes variable band signal extractors 111 and 112 for extracting a signal in each frequency band from input signals and distortion generators 131*a* and 132*a* which is provided with the extracted signals and which generates at least one of the odd number distortion components of the signals and making it as an output from the distortion generating paths $P_{D1}$ and $P_{D2}$ for frequency bands; and wherein the frequency band controller 6 controls frequency bands of the variable band signal extractors 111 and 112.

11 Claims, 10 Drawing Sheets

U.S. PATENT DOCUMENTS

| | | | |
|---|---|---|---|
| 2006/0088124 A1 | 4/2006 | Mizuta et al. | |
| 2006/0276146 A1* | 12/2006 | Suzuki et al. | 455/114.3 |

FOREIGN PATENT DOCUMENTS

| | | |
|---|---|---|
| GB | 2 359 432 A | 8/2001 |
| JP | 7-50841 | 5/1995 |
| JP | 7-101819 | 11/1995 |
| JP | 2000-244342 | 9/2000 |
| JP | 2002-64340 | 2/2002 |
| JP | 2002-506307 | 2/2002 |
| JP | 2002-84146 | 3/2002 |
| JP | 2002-135063 | 5/2002 |
| JP | 2002-158545 | 5/2002 |
| JP | 2002-522989 | 7/2002 |
| JP | 2002-280999 | 9/2002 |
| JP | 2003-92518 | 3/2003 |
| JP | 2004-128867 | 4/2004 |
| WO | WO 00/ 74232 | 12/2000 |

OTHER PUBLICATIONS

Toshio Nojima, et al., "Cuber Predistortion Linearizer for Relay Equipment in 800 MHz Band Land Mobile Telephone System", IEEE Transactions on Vehicular Technology, vol. VT-34, No. 4, Nov. 1985, pp. 169-177.

Tri T. Ha, "Solid-State Microwave Amplifier Design", Krieger Publishing Company, Chapter 6, 1991, pp. 202-283.

U.S. Appl. No. 11/434,068, filed May 16, 2006, Mizuta et al.

U.S. Appl. No. 11/444,494, filed Jun. 1, 2006, Suzuki et al.

U.S. Appl. No. 11/446,381, filed Jun. 5, 2006, Suzuki et al.

* cited by examiner

POWER SERIES TYPE PREDISTORTER FOR MULTI-FREQUENCY BANDS OPERATION

TECHNICAL FIELD

The present invention relates to a power series type predistorter for multi-frequency bands operation, for compensating a distortion generated by a power amplifier that amplifies the power of a high frequency signal adaptively changing a plurality of frequency bands.

BACKGROUND ART

A predistortion linearizer employing digital signal processing (hereinafter referred to as a digital predistortion method) has been known as one of non-linear distortion compensation methods of a microwave power amplifier (for example, Patent literature 1). The digital predistortion method is characterized by eliminating a complicate analog circuit by enabling a predistorter to be configured with digital signal processing.

As a configuration of a digital predistorter, a configuration with a lookup table having a table for previously linearizing non-linear characteristics of an amplifier has been known (for example, Non Patent literature 1 and Patent literature 2). The digital predistorter with a lookup table feeds back an output signal of the amplifier and updates the setting values of the lookup table so as to make a distortion component equal to or less than the designed value. In this manner, the digital predistorter is known as being able to compensate for distortion components.

A predistorter based on a power series model has been known. The power series type predistorter has been realized by an analog circuit, achieving the distortion improvement equal to or more than 30 dB (Non Patent literature 2). The power series model has been known to accurately model non-linear characteristics of an amplifier (for example, Non Patent literature 3). In a distortion compensation method in a digital predistorter using a power series model, a signal for correcting a coefficient of each order needs to be extracted from an output signal of the amplifier by the power series model. The technique disclosed in Patent literature 1 extracts a correction signal by removing a fundamental wave from an output signal of a power amplifier. As a method for more simply extracting a correction signal of a power series model, a method using two carrier waves of different frequencies and an equal level as a pilot signal has been known (Non Patent literature 2).

For the existing wireless systems, for example, a PDC (Personal Digital Cellular), a GSM (Global System for Mobile Communications), and an IMT-2000 (International Mobile Telecommunication 2000) have been operated. On the other hand, there is a technique for implementing a radio apparatus by software so that the radio apparatus can accommodate a plurality of wireless systems by using a single hardware. If a radio apparatus can accommodate a plurality of wireless systems by using a single hardware, a user of a single hardware can use a single mobile communication provided by a wireless system without thinking about the wireless system or a core network in the background of the wireless system. Actually, however, a single hardware accommodating a plurality of wireless systems has not been realized yet.

It may become that the services to be provided by wireless systems would be different for each area or each operator, while the wireless systems would be diversified. As a result, wireless systems optimum for respective objects may need to coexist in the same time and at the same place.

As a method using the plurality of wireless systems, a multi-band wireless system has been known. The multi-band wireless system adaptively varies a frequency band to use or the number of frequency bands to use according to a propagation environment or a traffic state. In order to reserve a predetermined transmission quality or a predetermined transmission capacity, a multi-band transmission using unused frequency bands is effective. In the multi-band wireless system, the number of frequency bands to be used is always varied according to the transmission state which should be guaranteed in each wireless system. The number of channels to be used also varies in the same band. If a frequency band used by a business entity and a frequency band used by anther business entity coexist, the multi-band wireless system can improve efficiency in using a frequency by executing adaptive control on the use of a free frequency band through technologies of interference recognition, frequency sharing, interference canceling, reduction in giving-interference, and multi-band controlling.

In a power series type predistorter for a base station adapted to such a multi-band wireless system, there has been a method for composing a power series type predistorter that has distortion generators corresponding to a plurality of frequency bands and sharing a conventional delay line of a power series type predistorter. In a method for arranging such a plurality of power series type predistorters merely in parallel, transmitting signals in a plurality of frequency bands are inputted into respective distortion generators. Each distortion generator adjusts an amplitude and a phase of each inputted transmitting signal so that distortion compensation is executed for each frequency band.

If transmitting signals to be inputted into the distortion generators means are transmitting signals in a plurality of frequency bands, optimum adjustment of amplitudes and phases cannot be executed on the transmitting signals in respective frequency bands. For example, if the transmitting signals are in 800 MHz band and in 1.5 GHz band, the distortion generator can set optimum amplitude and phase for 800 MHz band but requires amplitude and phase setting means which enables high-speed operation for following the difference in frequency by 700 MHz to set optimum amplitude and phase in 1.5 GHz that is 700 MHz different from 800 MHz. However, such a high-speed amplitude and phase setting means has not been developed yet.

Even with a plurality of power series type predistorters that operate in respective frequency bands, a power series type predistorter that operates in a plurality of frequency bands cannot be created.

In a multi-band wireless system with a plurality of transmitting bands, frequency bands can be changed according to a service state of the wireless system, interference to another wireless system, or the like. When a frequency band or the like for a wireless system is changed, a conventional power series type predistorter that fixes a frequency band to compensate for distortion cannot adaptively change operating frequency.

A power series type predistorter to be used in a long time needs to execute improvement and change on a power series type predistorter at each base station, thus needs tremendous efforts and time in readjusting so many power series type predistorters to change frequency bands. A power series type predistorter configuration that can be economized by eliminating such efforts and time is required.

For example, a power series type predistorter, which enables distortion compensation in the frequency bands f1 and f2 simultaneously, cannot execute the distortion compensation in the frequency bands f1 and f3 simultaneously when the frequency band f2 is changed to f3. This is because that loop adjustment cannot be done due to the fixed operating band of a conventional power series type predistorter and a difference between frequencies of f1 and f3 as mentioned above.

Patent literature 1: UK Patent Publication No. 2,335,812

Patent literature 2: National Publication of International Patent Application No. 2002-522989

Non Patent literature 1: H. Girard and K. Feher, "A new baseband linearizer for more efficient utilization of earth station amplifiers used for QPSK transmission", IEEE J. Select. Areas Commun. SAC-1, No. 1, 1983.

Non Patent literature 2: T. Nojima and T. Knno, "Cuber predistortion linearizer for relay equipment in 800 MHz band land mobile telephone system", IEEE Trans. Vech. Tech., Vol. VT-34, No. 4, pp. 169-177, 1985. 11.

Non Patent literature 3: Tri T. Ha, Solid-State Microwave amplifier Design, Chapter 6, Krieger Publishing Company, 1991.

SAMARY OF THE INVENTION

The present invention relates to a single power series type predistorter corresponding to a plurality of wireless system. The power series type predistorter switches the frequency band of a multi-band wireless system to a frequency band to be amplified by an operation center or a control device in a base station that control the frequency bands of a multi-band wireless system. The present invention intends to provide a power series type predistorter for multi-frequency bands, which allows to configure a transmission amplifier that enables dynamic change of distortion compensation. A power series type predistorter adapted for each frequency band is more disadvantageous than a single power series type predistorter in the scale of the device and the power consumption. If predistortion processing for a plurality of frequency bands is merged into one, the device can be simplified and downsized and power consumption is reduced.

According to the present invention, the power series type predistorter for multi-frequency bands includes:

a linear transmission path consisting of a delay element for delaying input signals;

N distortion generating paths, N being an integer equal to or greater than 2;

dividing means for dividing the input signals to the linear transmission path and said N distortion generating paths;

N variable band signal extractors each inserted corresponding one of said N distortion generating paths, for extracting signals in N different frequency bands from the input signals;

N distortion generators each inserted in corresponding one of said N distortion generating paths, for generating distortion components of a predetermined odd order of said signals in said N frequency bands;

combining means for combining an output from the linear transmission path and outputs from said N distortion generating paths and outputting a result of combining from the predistorter; and a frequency band controller for controlling frequency bands of said N variable band signal extractors.

EFFECTS OF THE INVENTION

The power series type predistorter for multi-frequency bands according to the present invention divides a plurality of band signals into respective bands, causes the odd order distortion to be generated for each frequency band, adjusts each frequency band so as to reduce the distortion components generated by said distortion components at a power amplifier, and combines the distortion components with the transmitting signals and inputs the result in the power amplifier. As a result, odd order distortion components in each frequency band at the output side of the power amplifier are removed.

That is to say, the predistorter can adjust the quantity of distortion compensation independently for each frequency band and collectively process the quantity of distortion compensation of a plurality of frequency bands. Accordingly, the present invention can simplify and downsize the device, and reduce power consumption.

The amplifier configuration of the present invention is characterized in that it can linearly amplify frequency bands corresponding to a service state of a wireless system and eliminate additional equipment as the frequency band changes or the carrier wave increases.

The present invention uses variable filters for a power series type predistorter to make change of the frequency band in simpler and less expensive way. The variable filter can vary the center frequency and the frequency bandwidth. A passband of the variable filter can accommodate change of the frequency of a wireless system at the single power series type predistorter when it is controlled to a band serviced at the time. As such, the power series type predistorter for multi-frequency bands operation according to the present invention is advantageous in eliminating operation of adjustment with tremendous efforts that are required by a conventional power series type predistorter as the predistorter of the present invention can switch operating band only by a frequency switching instruction from an operation center.

BEST MODES FOR CARRYING OUT THE INVENTION

Figure 1:
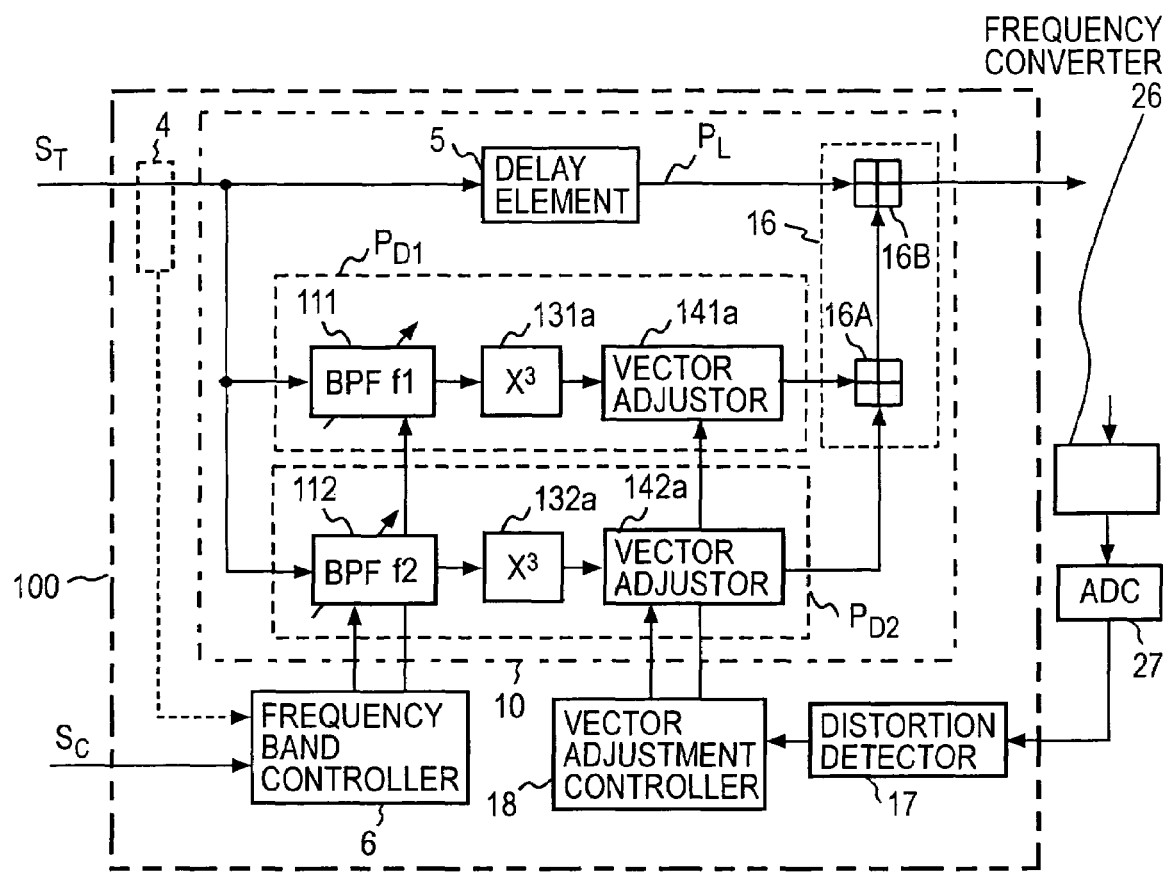
FIG. 1 is a diagram showing a predistortion circuit of the present invention.

Embodiments of the present invention will be described with reference to drawings. Like reference numerals are given to like components in the drawings and redundant descriptions will be omitted.

FIRST EMBODIMENT

FIG. 1 shows the first embodiment of a fundamental configuration of a power series type predistorter for multi-frequency bands according to the present invention. An input transmitting signal $S_T$ may be a base band signal, an intermediate frequency signal or a wireless frequency signal. The predistorter 100 includes a predistortion circuit 10, a frequency band controller 6, a distortion detector 17, and a vector adjustment controller 18. The predistortion circuit 10 includes a linear transmission path $P_L$, a third order distortion generating path $P_{D1}$ for a first frequency band, a third order distortion generating path $P_{D2}$ for a second frequency band, and a combiner 16 for combining outputted signals from these paths. The predistorter shown in FIG. 1 realizes distortion compensation in dual frequency bands (represented by the center frequencies f1 and f2). If the dual frequency bands are applied to a mobile radio, f1 is for 800 MHz band, for example, and f2 is for 1.5 GHz band, for example.

If the input transmitting signal $S_T$ is a base band signal, the center frequencies of the dual base band signals corresponding to the 800 MHz band and 1.5 GHz band may be, for example, $-(1500-800)/2=-350$ MHz and $+350$ MHz. Another example may be such that f1 is for 1.5 GHz band and f2 is for 2 GHz band. Moreover, the number of frequency bands is not limited to two and may be adapted to any number equal to or more than two. Not only a third order distortion generator but also fifth and higher odd order distortion generators may be added to the distortion generating path of each frequency band. In the description below, even the center frequencies of base band signals will be represented by the center frequencies f1 and f2 of the dual frequency bands for the corresponding high frequency transmitting signals, for convenience.

The transmitting signal $S_T$ is divided into the linear transmission path $P_L$ and the first and second distortion generating paths $P_{D1}$ and $P_{D2}$ corresponding to dual frequency bands. The first distortion generating path $P_{D1}$ consists of a cascade connection of a variable band signal extractor 111 (represented by BPF in the figure) of the first frequency band, a third order distortion generator 131a, and a vector adjuster 141a. The second distortion generating path $P_{D2}$ consists of a cascade connection of a variable band signal extractor 112 of the second frequency band, a third order distortion generator 132a and a vector adjustor 142a. Outputs from the first and second distortion generating paths $P_{D1}$ and $P_{D2}$ are combined at an adder 16A. The combined result is combined with an output from the linear transmission path $P_L$ at an adder 16B. The adders 16A and 16B constitute a combiner 16.

If the predistortion circuit 10 is an analog configuration, a delay element 5 of the linear transmission path $P_L$ may be composed of a delay line. Each of the variable band signal extractors 111 and 112 may consist of a variable band-pass filter or a variable band elimination filter. A center frequency and a bandwidth of each of these variable filters are controlled by a frequency band controller 6. The frequency band controller 6 controls the variable band signal extractors 111 and 112 according to a control signal $S_C$ from an operation center or the like. Alternatively, as will be mentioned later, each frequency band may be detected from a transmitting signal $S_T$ divided by the divider 4 denoted by a dotted line, and the variable band signal extractors 111 and 112 may be automatically controlled based on the detected result.

A band signal of the center frequency f1 that is extracted at the variable band signal extractor 111 is supplied to the third order distortion generator 131a. Denoting the input signal by X, the third order distortion generator 131a generates a third order distortion $X^3$ of a transmitting signal in the frequency band of the center frequency f1. The vector adjustor 141a consists of a cascade connecting circuit of a variable attenuator and a variable phase device. The vector adjustment controller 18 controls the vector adjustor 141a so that an amplitude of a third order distortion component generated at the power amplifier (not shown) connected with an output side of the predistorter and detected at the distortion detector 17 matches that of a third order distortion component generated at the third order distortion generator 131a, and the phase of the third order distortion component generated at the power amplifier becomes opposite to that of the third order distortion component generated at the third order distortion generator 131a.

Similarly, the band signal of the center frequency f2 that is extracted at the variable band signal extractor 112 is supplied to the third order distortion generator 132a, and the third order distortion component of the transmitting signal in the frequency band f2 is generated. The vector adjustment controller 18 controls the vector adjustor 142a consisting of a cascade connection of a variable attenuator and a variable phase shifter so that an amplitude of the third order distortion component also matches that of a third order distortion component in the frequency band f2 generated at the power amplifier, and the phase of the third order distortion component generated by the third order distortion generator 132a becomes opposite to that of the third order distortion component in the frequency band f2 generated at the power amplifier. When a predistorter 10 is a digital configuration, adjustment of the vector adjustors 141a and 142a is controlled such that a part of the output of the power amplifier (not shown) is branched and converted into a base band signal at the frequency converter 26, the base band signal is converted into a digital signal at the analog/digital converter (hereinafter referred to an ADC) 27, a distortion component is detected from the digital signal by the distortion detector 17 and the power of the detected distortion component is minimized.

The distortion components generated at the first and second distortion generating paths $P_{D1}$ and $P_{D2}$ are added at the adder 16A, the added result is combined with the delayed transmitting signal from the linear transmission path $P_L$ at the adder 16B, and the combined result is outputted from the predistorter 100 as a transmitting signal with added predistortion. The output from the predistorter 100 is converted into a signal in the transmitting signal frequency band by the frequency converter (not shown) as required, amplified at a power amplifier, and emitted as a radio wave from a transmission antenna. Accordingly, the distortion detector 17 includes a variable band signal extractors for extracting the frequency bands f1 and f2.

Characteristics of the variable band signal extractors 111 and 112 have desired bandwidths whose center frequencies are f1 and f2, respectively, and extract signals in the first and second frequency bands, respectively. Each of such band signal extractors may consist of a variable band-pass filter (band-pass filter: BPF), for example, or a variable band elimination filter (band elimination filter: BEF). Although the embodiment shown in FIG. 1 shows the case where the third order distortions are generated by the distortion generating paths $P_{D1}$ and $P_{D2}$ as a case of compensating for the third order distortion of a power amplifier, the present invention is typically adapted to generate the same odd order distortion as that to be compensated for which is generated by the power amplifier.

Figure 2:
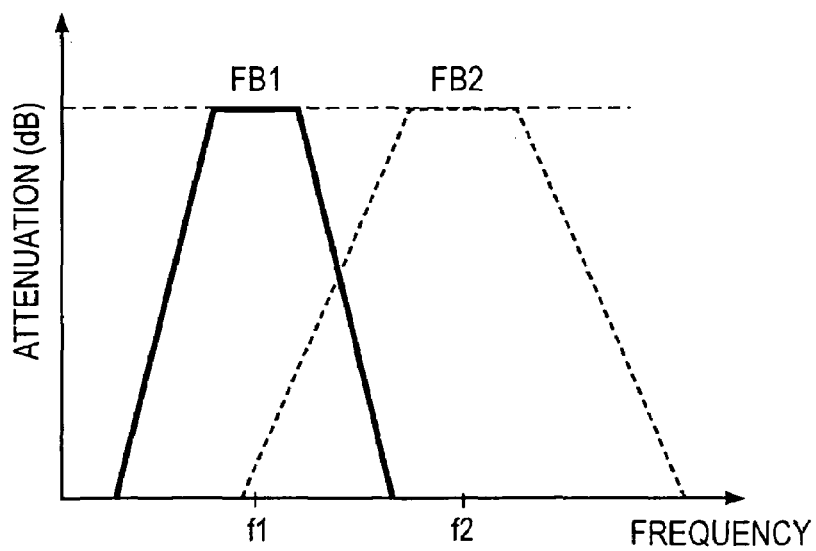
FIG. 2 is a diagram showing an example of frequency versus attenuating characteristics when a variable band signal extractor consists of variable band-pass filter.

FIG. 2 schematically shows frequency versus attenuating characteristics by a solid line and a dotted line when the variable band signal extractors 111 and 112 consist of variable band elimination filters respectively. The characteristics should be such that an attenuation steeply increases outside the bands whose center frequencies are f1 and f2 respectively, and separation between the frequency bands is sufficiently large. Such characteristics can be generally obtained when a plurality of band-pass filters are connected in cascade.

Figure 3:
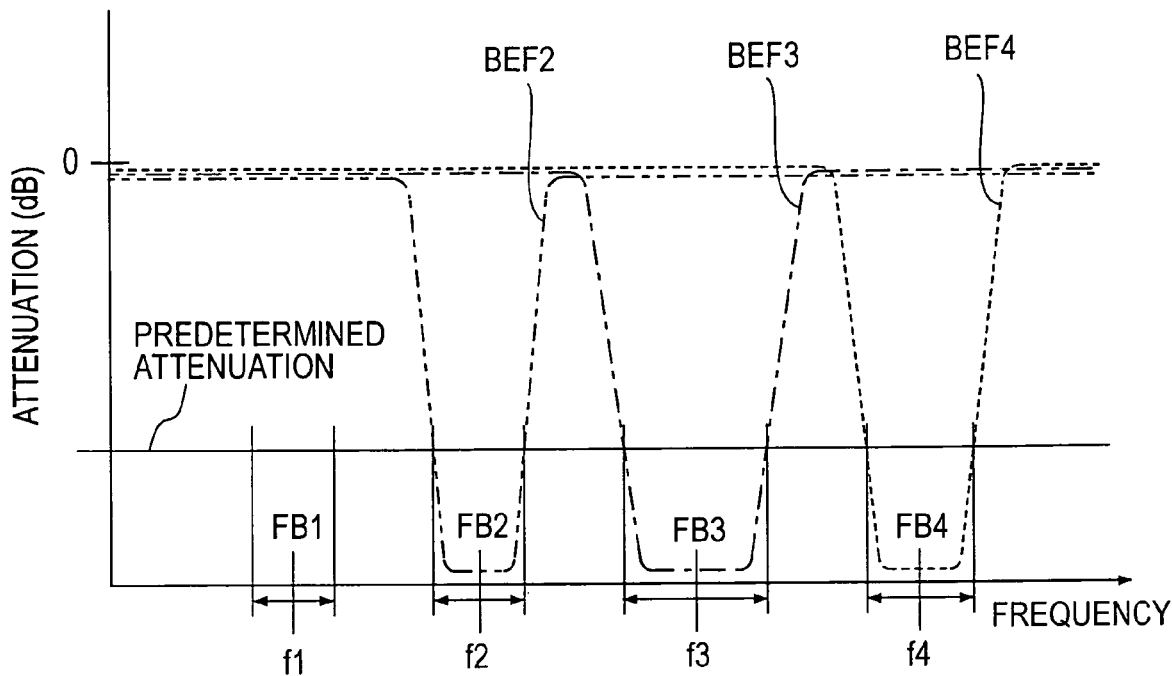
FIG. 3 is a diagram showing an example of frequency versus attenuating characteristics when the variable band signal extractors consist of variable band eliminating filters.
Figure 4:
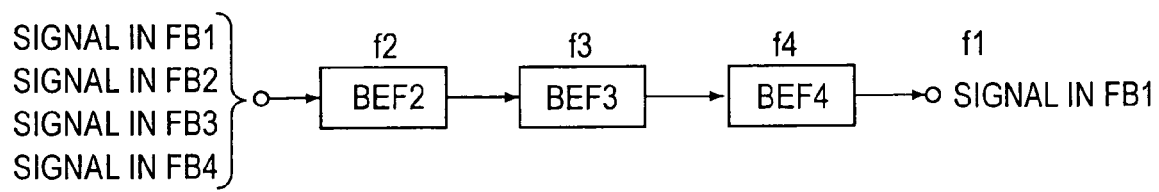
FIG. 4 is a diagram showing a cascade connection of variable band elimination filters.

FIG. 3 shows frequency versus attenuating characteristics when each of the variable frequency band signal extractors 111 and 112 consist of variable band elimination filters, for example. This example schematically shows characteristics required of the first variable band signal extractor 111 when the third and fourth distortion generating paths whose center frequencies are f3 and f4 respectively are further added to the predistorter shown in FIG. 1. As apparent from FIG. 3, the characteristics can be formed by connecting three variable band elimination filters BEF2, BEF3 and BEF4, each of which eliminates the second, third and fourth frequency bands FB2, FB3 and FB4 other than the first frequency band FB1, by connecting them in cascade as shown in FIG. 4.

Each variable band elimination filter is adapted to have enough band elimination characteristics for the band and sufficiently low-loss transmission characteristics in the bands other than said band. Each of such variable band elimination filters can be constructed of a notch filter, for example. A notch filter can be realized by a band elimination filter which uses a dielectric resonator or a filter which uses a stab with a micro strip line. Although not shown in the, figure, characteristics of the second variable band signal extractor 112 can also be formed by connecting three band elimination filters which respectively eliminate the other first, third and fourth frequency bands FB1, FB3 and FB4 by a cascade connection. This is also true for the third and fourth variable band signal extractors (not shown).

If each of the variable frequency band signal extractors 111 and 112 consists of variable band-pass filters, it is advantageous that a periphery of a frequency band around the center frequency can be easily extracted and isolation from the center frequency can be relatively easily established. As the center frequency becomes a resonance frequency of a band-pass filter, however, the delay of a signal increases. Therefore, the delay of the delay element 5 in the linear transmission path $P_L$ shown in FIG. 1 needs to be large according to said delay. This lowers stability of the predistorter. Particularly, if the predistorter consists of an analog circuit as will be mentioned later, a delay line constituting the delay element 5 of the linear transmission path $P_L$ becomes longer and an attenuation of signals becomes larger. If each of the variable frequency band signal extractors 111 and 112 consists of variable band elimination filters, a signal in the frequency band to be extracted is sufficiently distant from the center frequency, and the delay will be shorter. Therefore, it is advantageous that the line length of a linear transmission path $P_L$ is shorter and loss is smaller. Further, the variable band elimination filter can be easily designed.

In all the embodiments below, each variable band signal extractors may consist of variable band-pass filters or variable band elimination filters.

The variable band pass filter or the variable band elimination filter can vary the center frequency and/or the bandwidth. As a method for varying the center frequency, it is possible to vary the length of a resonator by a switch such as a diode or a MEMS switch in the case where the filter is formed in a micro strip line, for example. As a method for varying the bandwidth of the band-pass filter, it is possible to change the number of a bank of filters of different center frequencies.

Figure 5:
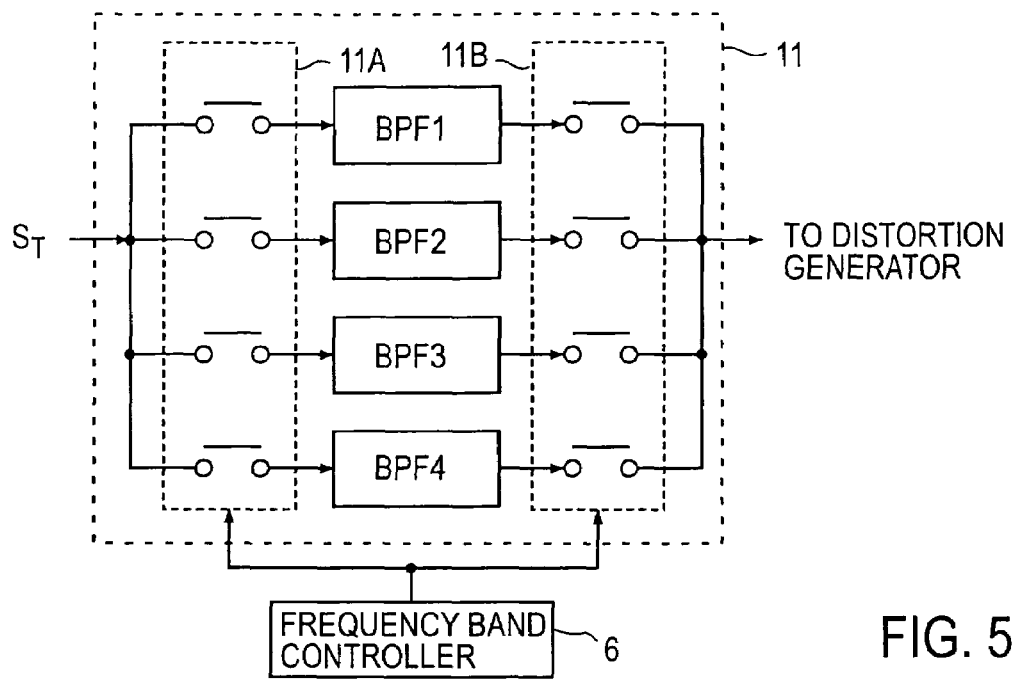
FIG. 5 is a diagram showing an example of a filter bank configuration with four filters.
Figure 6:
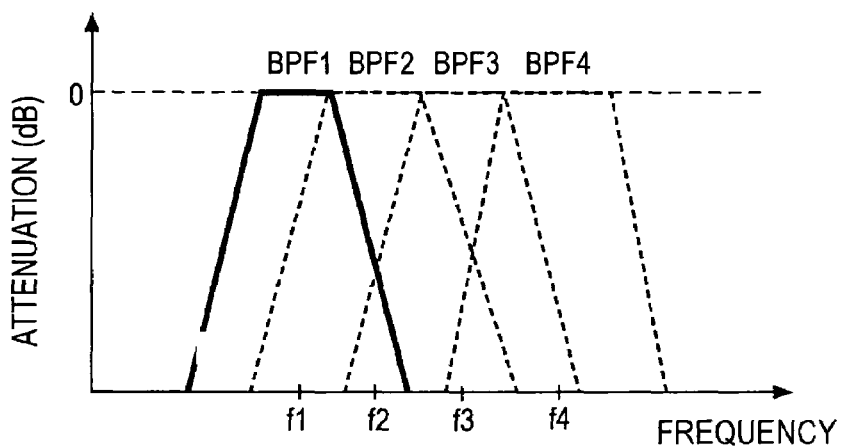
FIG. 6 is a diagram showing frequency characteristics of a filter bank.
Figure 7:
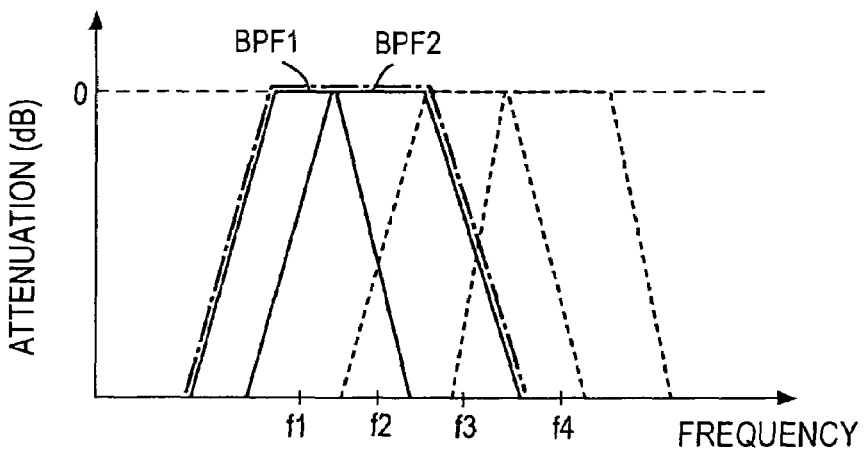
FIG. 7 is a diagram showing frequency characteristics of a filter bank.

FIG. 5 shows an example of the variable band signal extractor 11 consisting of a bank of four filters BPF1 to BPF4. The frequency band controller 6 controls selection of filters that are operated by ON/OFF of switches 11A and 11B that sandwich the filters BPF1 to BPF4. In FIG. 6, frequency characteristics of the filter (BPF1) is indicated by a heavy line and frequency characteristics of the other filters BPF2, BPF3 and BPF4 are indicated by dashed lines, respectively. FIG. 7 shows combined frequency characteristics of the bank of filters by a chain line when the filter (BPF1) and the filter (BPF2) are selected at the same time. BPF1 and BPF2 have adjoining frequency characteristics shown by solid lines and the frequency characteristics of the filter bank are a combination of the frequency characteristics of BPF1 and BPF2. If bandwidths of BPF1 and BPF2 are equal, the center frequency of the combined bandwidth will be (f1+f2)/2. In this manner, by using a bank of filters, it is possible to form a variable filter which can vary the pass-bandwidth and the center frequency. As a method for varying a bandwidth of the band elimination filter, it is possible to switch resonators formed of a micro strip line by using a diode, a MEMS switch or the like.

The variable frequency band signal extractors 111 and 112 vary each or both of the center frequency and the pass-bandwidth in response to an instruction from the frequency band controller 6. The frequency band controller 6 varies the center frequency or the bandwidth of the frequency band to be subjected to distortion compensation by the power series type predistorter in accordance with a control signal $S_C$ based on an instruction from an operator center or the like of a network. The control period or the control speed differs for each wireless system. As an initial pulling-in operation according to distortion compensation of the power series type predistorter is done in high speed, the first embodiment can change settings of the variable band signal extractors 111 and 112 if only the control period or the control speed is at least equal to or more than the initial pulling-in operation.

SECOND EMBODIMENT

Figure 8:
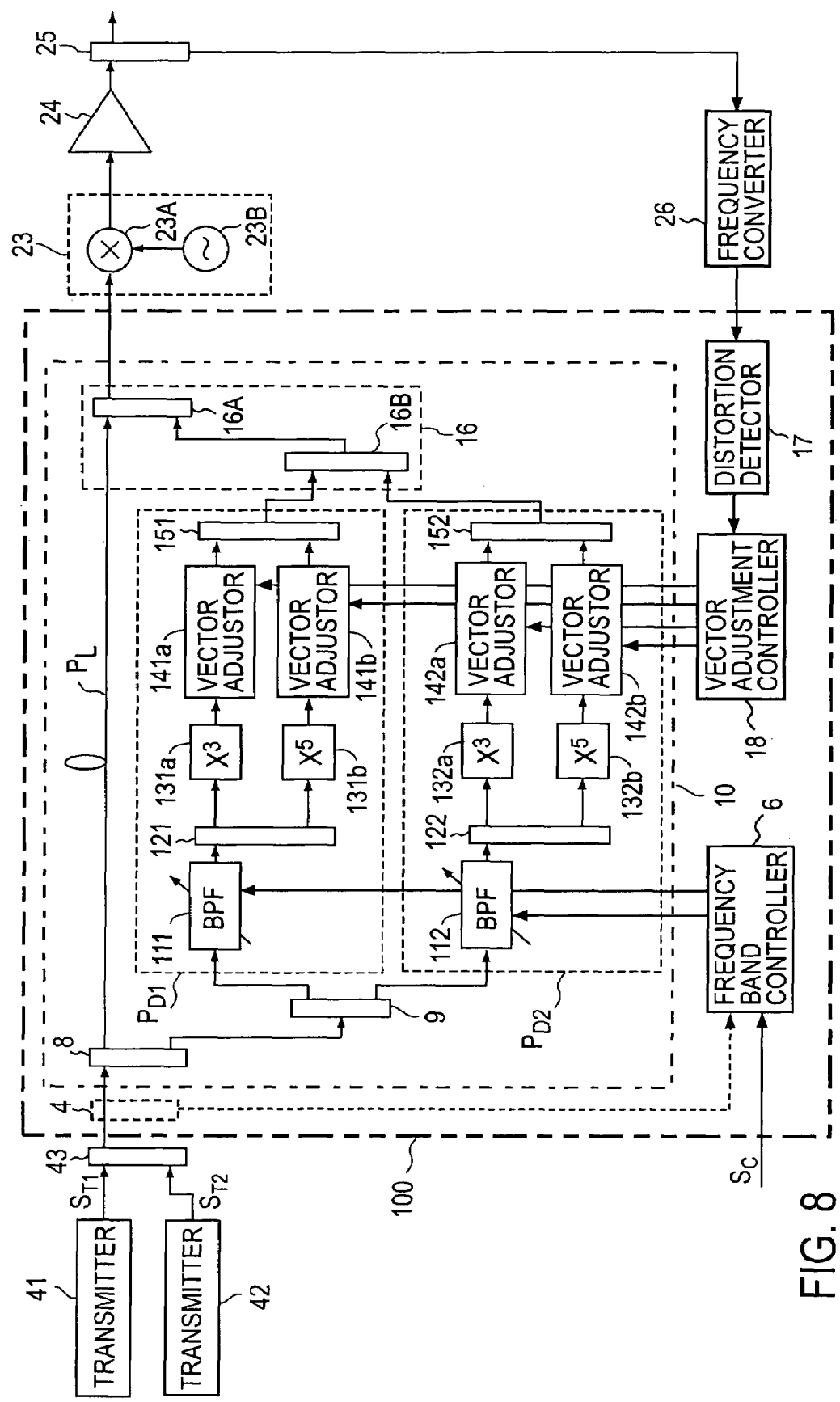
FIG. 8 is a diagram showing a second embodiment of the predistorter according to the present invention.

FIG. 8 shows a second embodiment of the predistorter according to the present invention. This embodiment shows a case where the predistorter 100 consists of an analog circuit and input intermediate frequency signals $S_{T1}$ and $S_{T2}$ whose center frequencies are f1 and f2 are inputted from transmitters 41 and 42. The center frequencies f1 and f2 of the transmitting signals $S_{T1}$ and $S_{T2}$ are assumed to be divided by about 100 MHz apart from each other, which is large enough than the bandwidth of each band. In this embodiment, the distortion generating paths $P_{D1}$ and $P_{D2}$ of the frequency bands f1 and f2 are each adapted to generate a third order distortion and a fifth order distortion of the input signals so as to compensate for the third order distortion and the fifth order distortion.

A divider 8 for an input of an analog predistortion circuit 10 is constructed of a wide band (equal to or greater than the bandwidth of an input signal) directional coupler or a power divider. The distortion generating path $P_{D1}$ has a variable band signal extractor 111 for extracting a transmitting signal $S_{T1}$ in the frequency band FB1, a divider 121 for dividing the extracted signal into two, a third order distortion generator 131a provided with one of the divided signals for generating a third order distortion component of the transmitting signal $S_{T1}$, a fifth order distortion generator 131b provided with the other of the divided signals for generating a fifth order distortion component of the transmitting signal $S_{T1}$, vector adjustors 141a and 141b for adjusting a phase and an amplitude of each of the third order and fifth order distortion components outputted from the distortion generators 131a and 131b, and a combiner 151 for combining outputs from the vector adjustors 141a and 141b.

Similarly, the distortion generating path $P_{D2}$ has a variable band signal extractor 112 for extracting a transmitting signal $S_{T2}$ in the frequency band FB2, a divider 122 for dividing the extracted signal into two, a third order distortion generator 132a provided with one of the divided signals for generating the third order distortion component of the transmitting signal $S_{T2}$ in the frequency band f2, a fifth order distortion generator 132b provided with the other of the divided signals for generating the fifth order distortion component of the transmitting signal $S_{T2}$ in the frequency band BF2, vector adjustors 142a and 142b for adjusting a phase and an amplitude of each of the third order and fifth order distortion components from each of the third order and fifth order distortion generators 132a and 132b, and a combiner 152 for combining outputs from the vector adjustors 142a and 142b. The outputs from the combiners 151 and 152 are combined at the first output combiner 16B and the combined result is combined with an output from the linear transmission path $P_L$ at the combiner 16A. Accordingly, the third order distortion component and the fifth order distortion component generated in the respective frequency bands are added as predistortions to the transmitting signals $S_{T1}$, $S_{T2}$ in the frequency bands FB1 and FB2 that are conveyed through the linear transmission path $P_L$.

The vector adjustors 141a, 141b, 142a and 142b are also provided for setting so that amplitudes of distortion components generated at the distortion generators match those of the third order distortion components and the fifth order distortion components generated at the power amplifier in each of the frequency bands FB1 and FB2 and the phase of the distortion components generated at the distortion generators become opposite to those of the third order distortion components and the fifth order distortion components generated at the power amplifier. This initial setting state is maintained by control operation of the vector adjustment controller 18.

The output signal from the analog predistortion circuit 10 is mixed with a carrier signal from a local oscillator 23B in a mixer 23A of a frequency converter 23, the frequency is converted into a predetermined transmitting frequency band and provided to the power amplifier 24. Most part of an output from the power amplifier 24 is sent out via a divider 25 to a duplexer not shown and the remaining part divided by the divider 25 is converted into intermediate frequency signal by a frequency converter 26, and provided to a distortion detector 17. The distortion detector 17 detects the third order distortion component and the fifth order distortion component generated by the power amplifier 24 in connection with each of the transmitting signals $S_{T1}$ and $S_{T2}$ and provides them to the vector adjustment controller 18. The vector adjustment controller 18 adjusts vector adjustors 141a, 141b, 142a and 142b so as to minimize the detected third order distortion components and fifth order distortion components. Accordingly, the predistortion added by the analog predistortion circuit 10 for each frequency band cancels distortion components generated when the power amplifier 24 amplifies transmitting signals in different frequency bands.

Intermodulation distortion components that are produced in the power amplifier 24 by transmitting signals in a plurality of transmitting frequency bands are produced at frequency intervals of the signals. Such intermodulation distortion componentss can be easily removed by a duplexer or a band-pass filter for outputs from the power amplifier 24. The variable band signal extractors 111 and 112 in the second embodiment may be realized by a combination of directional couplers.

Although a case where the third order distortion and fifth order distortion are generated in each of the frequency bands FB1 and FB2, the embodiment may be adapted so that, if required, seventh order distortion components are also generated or combination of distortions other than the set of abovementioned third and fifth orders is generated depending on characteristics of a power amplifier to be compensated. Such a configuration can be easily developed from FIG. 8. Although the frequency bands are assumed to be FB1 and FB2 in this embodiment, the abovementioned configuration can be easily expanded to increase the number of frequency bands. Those modifications can also apply to the other embodiments described below.

THIRD EMBODIMENT

Figure 9:
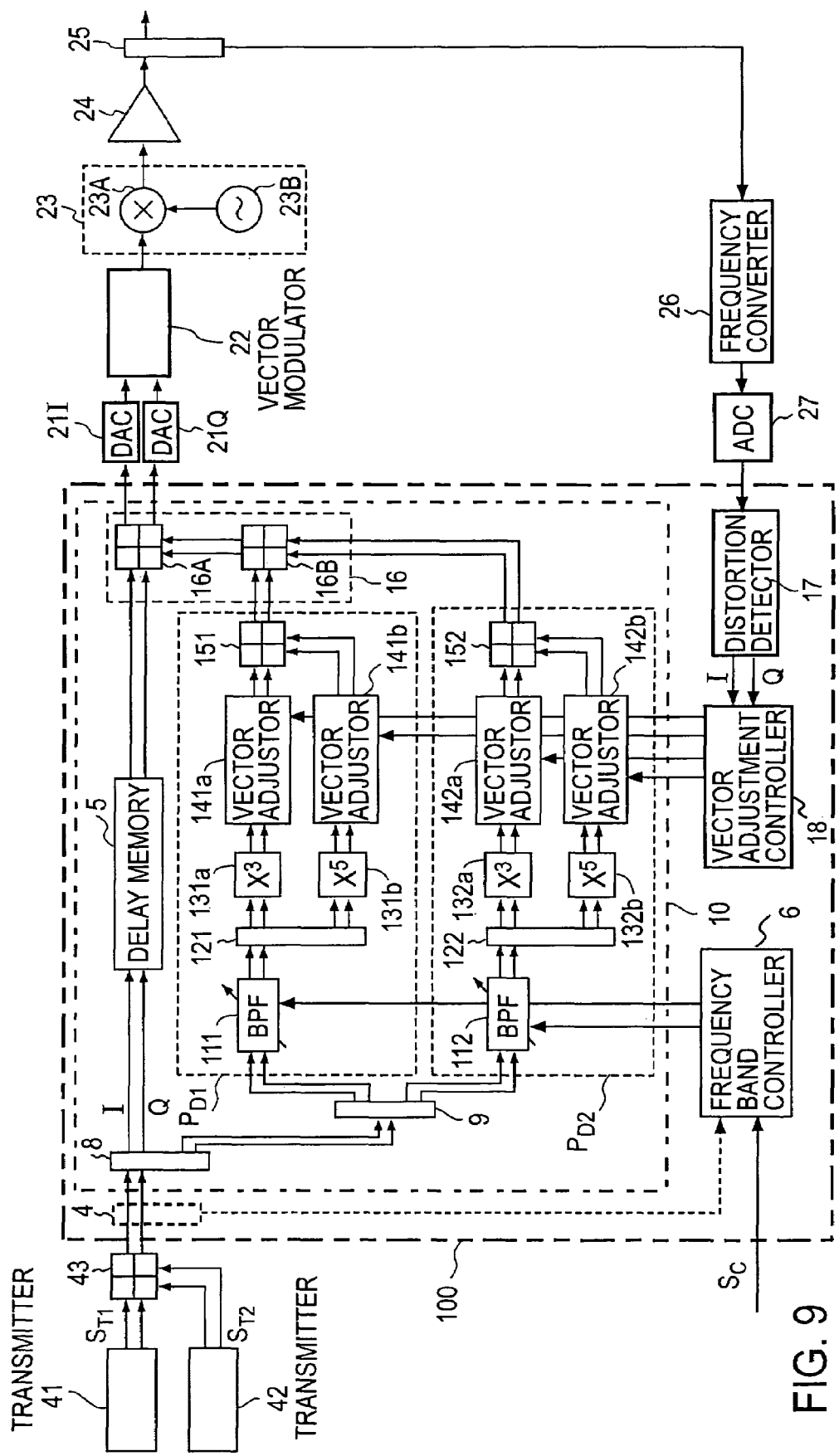
FIG. 9 is a diagram showing a third embodiment of the predistorter according to the present invention.

FIG. 9 shows a third embodiment of the predistorter according to the present invention. The embodiment is adapted to realize the predistorter 100 shown in FIG. 8 by digital signal processing, with each signal consisting of a pair of an in-phase signal (I signal) and a quadrature signal (Q signal). Also in this embodiment, the predistortion circuit 10 has a divider 8 for dividing input signals, a linear transmission path $P_L$ consisting of a delay memory as the delay element 5, a variable band signal extractor 111 for extracting signals in the frequency band FB1 by digital signal processing, a variable band signal extractor 112 for extracting signals in the frequency band FB2 by digital signal processing, third and fifth order distortion generators 131a, 131b and 132a, 132b for generating a third order distortion component and a fifth order distortion component in each of the frequency bands FB1 and FB2, and vector adjustors 141a, 141b, 142a and 12b.

Each of the combiners 43, 151, 152, 16A and 16B in FIG. 8 is constructed of an adder in FIG. 9. In the distortion detector 17, base band signals from the frequency converter 26 are provided by an analog/digital converter (ADC) 27 as digital signals, distortion components are extracted from the base band signals and then subjected to quadrature-detection to obtain an in-phase signal (I signal) and a quadrature signal (Q signal). The distortion components are provided to the vector adjustment controller 18. The vector adjustment controller 18 adjusts the vector adjustors 141a, 141b, 142a and 142b so as to minimize the power of the detected distortion components.

The center frequencies f1 and f2 of the input signals are assumed to be apart about 100 MHz from each other, which is sufficiently larger than the bandwidth of each band. The divider 8 is constructed of combinations of variable bandpass filters implemented by digital signal processing. The variable band signal extractors 111 and 112 extract only signals in the frequency bands FB1 and FB2, respectively. The signals in the frequency band FB1 extracted at the variable band signal extractor 111 are provided to the third order and fifth order distortion generators 131a and 131b, and the third order and fifth order distortion components of the signals are generated in this example. Amplitudes and phases of the third order distortion components and the fifth order distortion components are adjusted by the vector adjustors 141a and 141b, each composed of a variable phase shifter and a variable attenuator, under control of the vector adjustment controller 18.

Similarly, the signals in the frequency band FB2 extracted at the variable band signal extractor 112 are provided to the third order and fifth order distortion generators 132a and 132b to generate the third order and fifth order distortion components of the signals. Amplitudes and phases of the third order distortion component and the fifth order distortion component are adjusted by the vector adjustors 142a and 142b under control of the vector adjustment controller 18.

The third order and the fifth order distortion components generated by distortion generating paths $P_{D1}$ and $P_{D2}$ of the frequency bands FB1 and FB2 are combined at adders 151 and 152, and the combined results are further combined with the transmitting signals from the linear transmission path $P_L$ at the adder 16. The combined signals from the adder 16A are converted into analog signals at digital/analog converters 21I and 21Q. The analog signals are quadrature-modulated at the vector modulator 22, frequency-converted by a mixer 23A of a frequency converter 23 into predetermined transmitting frequency bands corresponding to FB1 and FB2 by a carrier signal of a frequency $f_c$ from a local oscillator 23B, and amplified at the power amplifier 24. At this moment, the third and fifth order distortion components added at the digital predistortion circuit 10 for each frequency band are canceled by distortion components generated by the power amplifier 24. Intermodulation distortion components may be generated among the transmitting signals of a plurality of transmitting frequency bands FB1 and FB2 at intervals of respective frequencies. However, such intermodulation distortion components are outside the transmitting signal frequency bands, and can be easily removed by a duplexer or a band-pass filter of a power amplifier output.

Although the number of frequency bands of transmitting signals is assumed to be two in this embodiment, the number can be easily increased by using the abovementioned configuration to more than two.

FOURTH EMBODIMENT

Figure 10:
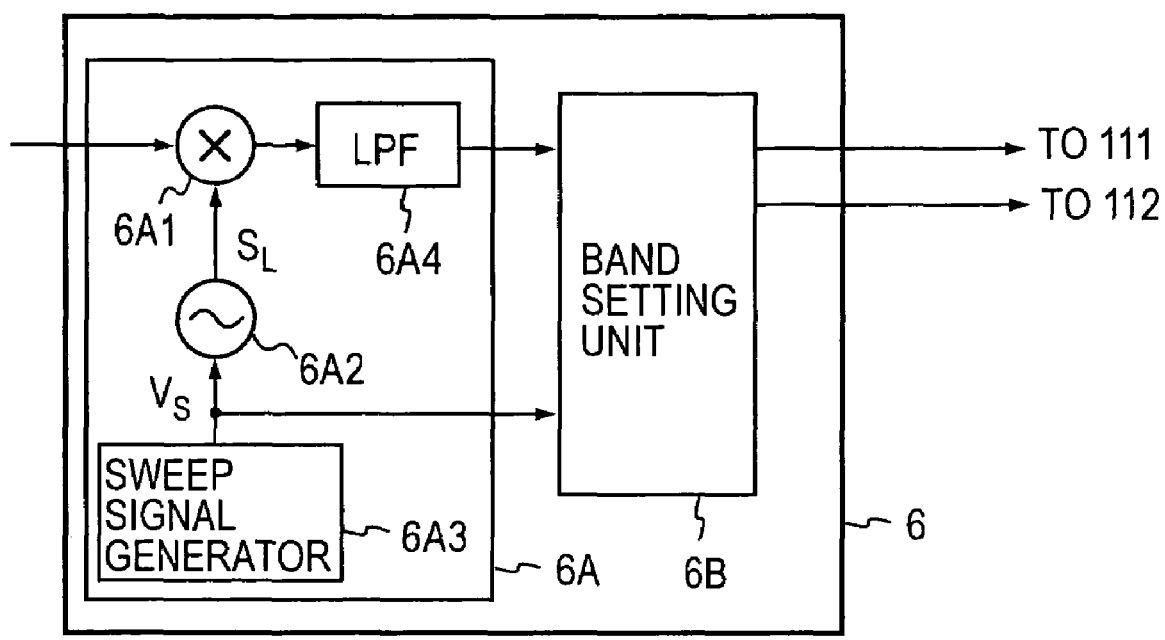
FIG. 10 is a diagram showing a configuration of a frequency band controller for executing automatic control.

FIG. 10 shows an exemplary configuration of a frequency band controller 6 for automatically controlling the variable band signal extractors 111 and 112 in the embodiment of each analog predistorter shown in FIGS. 1 and 8. The frequency band controller 6 of the embodiment consists of a band detector 6A and a band setting unit 6B. The band detector 6A consists of a mixer 6A1, a local oscillator 6A2, a sweep signal generator 6A3, and a low-pass filter (referred to as LPF) 6A4.

Figure 11A:
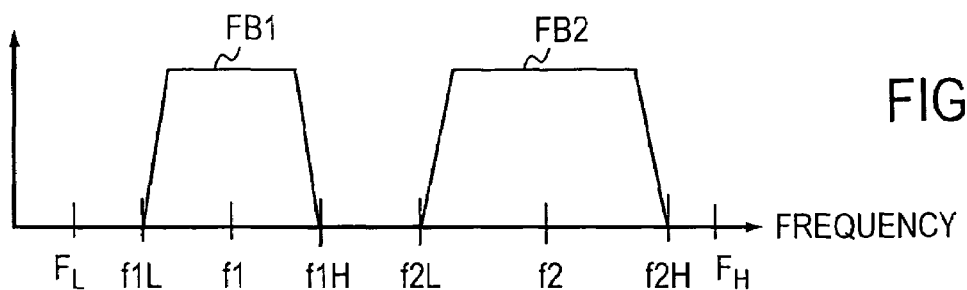
FIG. 11A is a schematic diagram showing an example of a spectrum of an input signal.
Figure 11B:
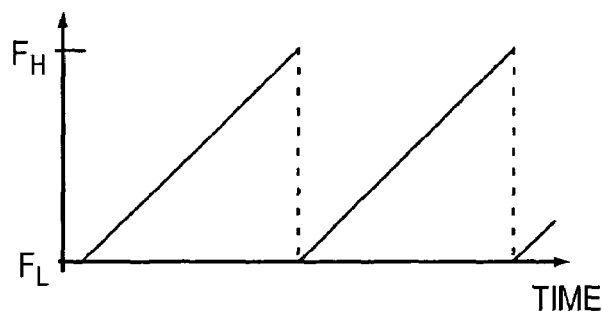
FIG. 11B is a diagram for illustrating a frequency sweep.

The input transmitting signals $S_T$ to the predistorter 100 are partly supplied to the mixer 6A1 of the frequency band controller 6 by the divider 4 of each of the abovementioned embodiments. The transmitting signals $S_T$ are assumed to include signals in the two frequency bands FB1 and FB2 whose center frequencies are f1 and f2, respectively, as shown in FIG. 11A, for example. The lower limit frequency of the frequency band FB1 is f1L, and the upper limit frequency of the frequency band FB1 is f1H. The lower limit frequency of the frequency band FB2 is f2L, and the upper limit frequency of the frequency band FB2 is f2H. The local oscillator 6A2 is a voltage controlled oscillator, for example, and generates a local signal SL whose frequency is swept by a sweep signal $V_S$ from the sweep signal generator 6A3, whose voltage changes in a sawtooth shape. The frequency sweep repeats sweeping in succession from a predetermined lower limit sweep frequency $F_L$ lower than the two frequency bands FB1 and FB2 shown in FIG. 11A to a predetermined upper limit sweep frequency $F_H$ higher than the two frequency bands, for example (see FIG. 11B).

Figure 11C:
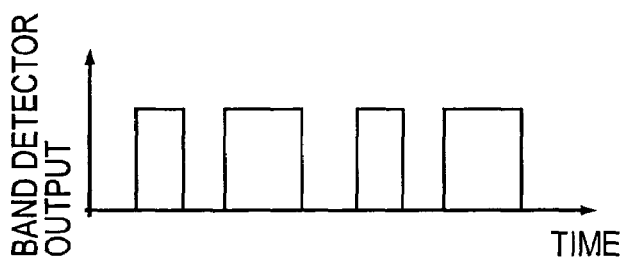
FIG. 11C is a diagram showing an example of a detection output by a band detector.
Figure 11D:
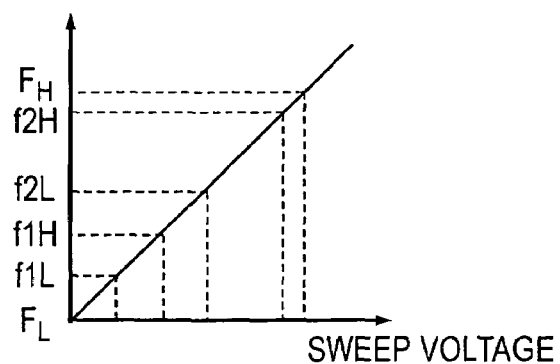
FIG. 11D is a diagram showing relationship between a sweep voltage and a sweep frequency.

The mixer 6A1 multiplies the local signal $S_L$ from the local oscillator 6A2 by the input signal $S_T$. Components around a direct current are extracted by an LPF 6A4 from the output of the mixer 6A1. That is, the direct current components are extracted by the LPF 6A4 during periods where the frequency components of the input signal $S_T$ and a sweep frequency of the local signal $S_L$ match, as shown in FIG. 11C. The extracted direct current components are provided to the band setting unit 6B as a detected band signal output from the band detector 6A. Relationship between a sweep signal voltage $V_S$ and a sweep frequency is previously measured as shown in FIG. 11D. The band setting unit 6B detects the lower frequency f1L and the upper frequency f1H of the frequency band FB1 and the lower frequency f2L and the upper frequency f2H of the frequency band FB2 by using the detected band signal from the LPF 6A4 and the sweep signal voltage $V_S$. The center frequency of each band is obtained as f1=(f1L+f1H)/2 and f2=(f2L+f2H)/2.

Figure 11E:
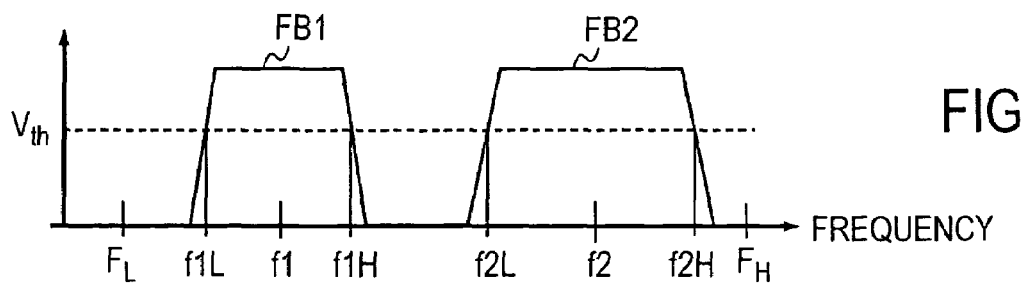
FIG. 11E is a diagram for illustrating band detection by a threshold.

Specifically, the band setting unit 6B determines, as shown in FIG. 11E, sweep frequencies f1L, f1H, f2L and f2H, successively, that match the threshold $V_{th}$ at the rise and the fall of the direct current component voltage outputted from the LPF 6A4 while the frequency is swept. As it is understood from FIG. 11E, however, bandwidths of the frequency bands FB1 and FB2 obtained from f1L, f1H, f2L and f2H that are determined from the threshold are narrower-than the actual bandwidths, the embodiment can accurately determine the lower frequencies and the upper frequencies by multiplying the detected f1L, f1H, f2L and f2H by a predetermined coefficient, respectively, for example.

The band setting unit 6B sets the center frequency f1, the lower frequency f1L and the upper frequency f1H of the frequency band FB1 determined in such a manner to the variable band signal extractor 111, and sets the center frequency f2, the lower frequency f2L and the upper frequency f2H of the frequency band FB2 to the variable band signal extractor 112. If a variable band signal extractor 11 shown in FIG. 5 is used as the variable band signal extractor 111, for example, a set of band-pass filters to be selected from the band-pass filters BPF1 to BPF4 is designated based on the determined center frequency, the lower frequency and the upper frequency.

If the frequency of the signal $S_T$ inputted to the power serial type predistorter 100 is dynamically changed, i.e., if the frequency of a signal inputted into a power amplifier is dynamically changed, the frequency band controller 6 needs to control the variable band signal extractors according to the dynamically changed frequency. The time length required for changing the frequency is determined by the time length of one cycle of the frequency sweep by the local oscillator 6A2. In the example of FIG. 10, the embodiment can increase detecting speed of the band detector 6A by speeding up the frequency sweep by the local oscillator 6A2.

The voltage controlled oscillator that can sweep a frequency may be such one that is used for a general signal generator. The low-pass filter 6A4 can be realized by a LC filter or an active filter implemented by an operational amplifier. The band setting unit 6B may be realized by an analog digital converter that digitizes a direct current voltage and a microprocessor. Although the frequency band controller 6 shown in FIG. 10 is of an analog predistorter, it can also be realized by the same functional configuration using a digital predistorter.

Band information can be obtained from an input signal by using the frequency band controller 6 of FIG. 10 in the power series type predistorter employed in a transmitter installed in a mobile communication base station, for example, without needing to obtain information on a frequency band from a modem. Therefore, the predistorter can solely set a frequency band for the variable band signal extractors. Accordingly, a control system can be simplified. If a modulator is installed in a relaying device at a foot of an antenna tower and a power amplifier including a lookup table predistorter is installed in a device at the top of the tower immediately below the antenna that is distant from the relaying device, information on an operational frequency needs not to be exchanged between the modulator and the power amplifying device. This enables each device to be independently serviced for maintenance such as adjustment or improvement.

FIFTH EMBODIMENT

Figure 12:
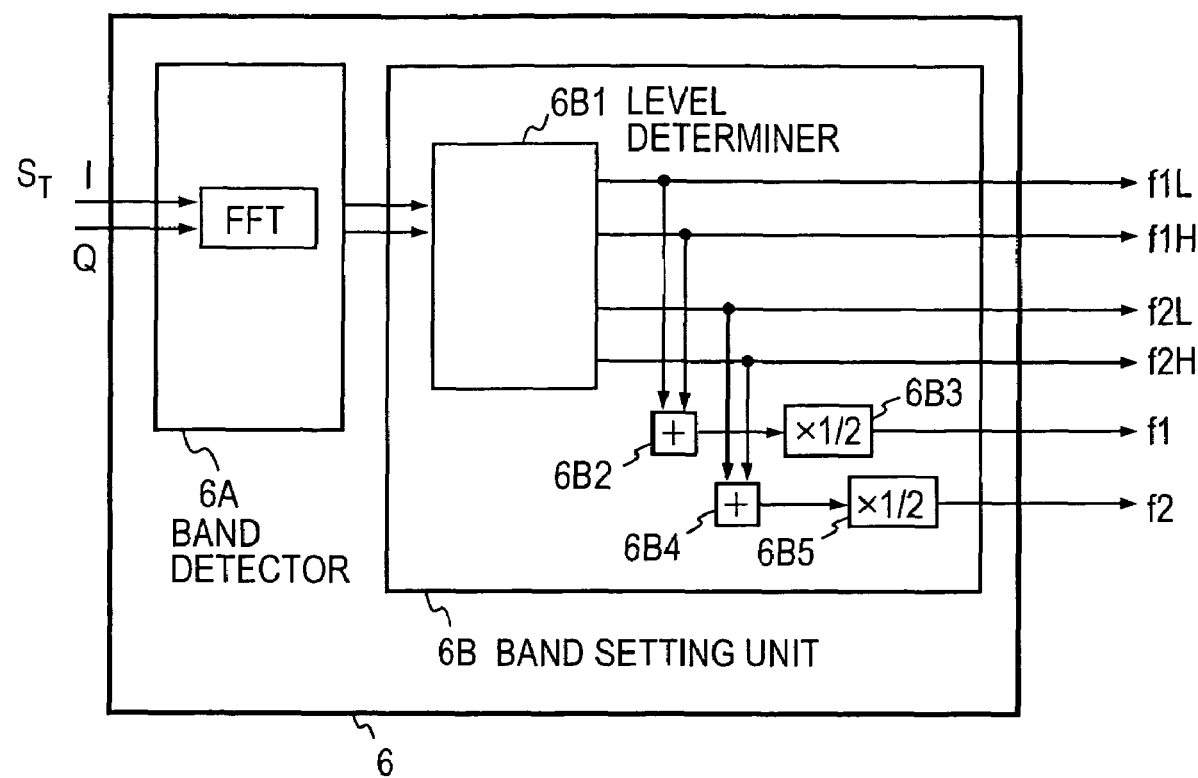
FIG. 12 is a diagram showing a configuration of a frequency band controller corresponding to a digital predistorter.

FIG. 12 shows a configuration of the frequency band controller 6 for automatically controlling the variable band signal extractors 111 and 112 in the embodiment of the predistorter in a digital configuration shown in FIG. 9. The frequency band controller 6 of the embodiment detects a transmitting frequency band included in the base band input signal $S_T$ (I signal and Q signal) provided from the divider 4.

The frequency band controller 6 consists of a band detector 6A and a band setting unit 6B. The band detector 6A consists of a fast Fourier transform unit (FFT). The band setting unit 6B consists of a level determiner 6B1, adders 6B2 and 6B4 and ½ multipliers 6B3 and 6B5.

The frequency components of the input signal $S_T$ is obtained by converting the input signal $S_T$ divided by the divider 4 from time domain to frequency domain by FFT operation. The level determiner 6B1 compares the frequency components detected by the FFT with a threshold $V_{th}$ preset as in the case of FIG. 11E, and detects frequencies that match the threshold as a lower frequency f1L and an upper frequency f1H of the frequency band FB1 and a lower frequency f2L and an upper frequency f2H of the frequency band FB2, respectively. The adder 6B2 calculates the sum of f1L and f1H, and the ½ multiplier 6B3 multiplies the sum by ½. The result of the multiplication is determined as a center frequency f1 of the frequency band FB1. Similarly, the adder 6B4 calculates the sum of f2L and f2H, and the ½ multiplier 6B5 multiplies the sum by ½. The result of the multiplication is determined as a center frequency f2 of the frequency band FB2. With f1, f1L, f1H, f2, f2L and f2H determined in this manner, each center frequency and each band of the various band signal extractors 111 and 112 are set.

Commercialized ICs can be used as the FFT. The frequency band detector 6A can be realized by using a DSP (Digital Signal Processor) or a FPGA (Field Programmable Gate Array) instead of an FFT. The level determiner 6B1 consists of a comparator. The low-pass detector 6A and the band setting unit 6B can be constructed of such simple circuits. The lower frequency, upper frequency and center frequency may be calculated by mathematical operations by using a DSP for the band setting unit 6B.

SIXTH EMBODIMENT

Figure 13:
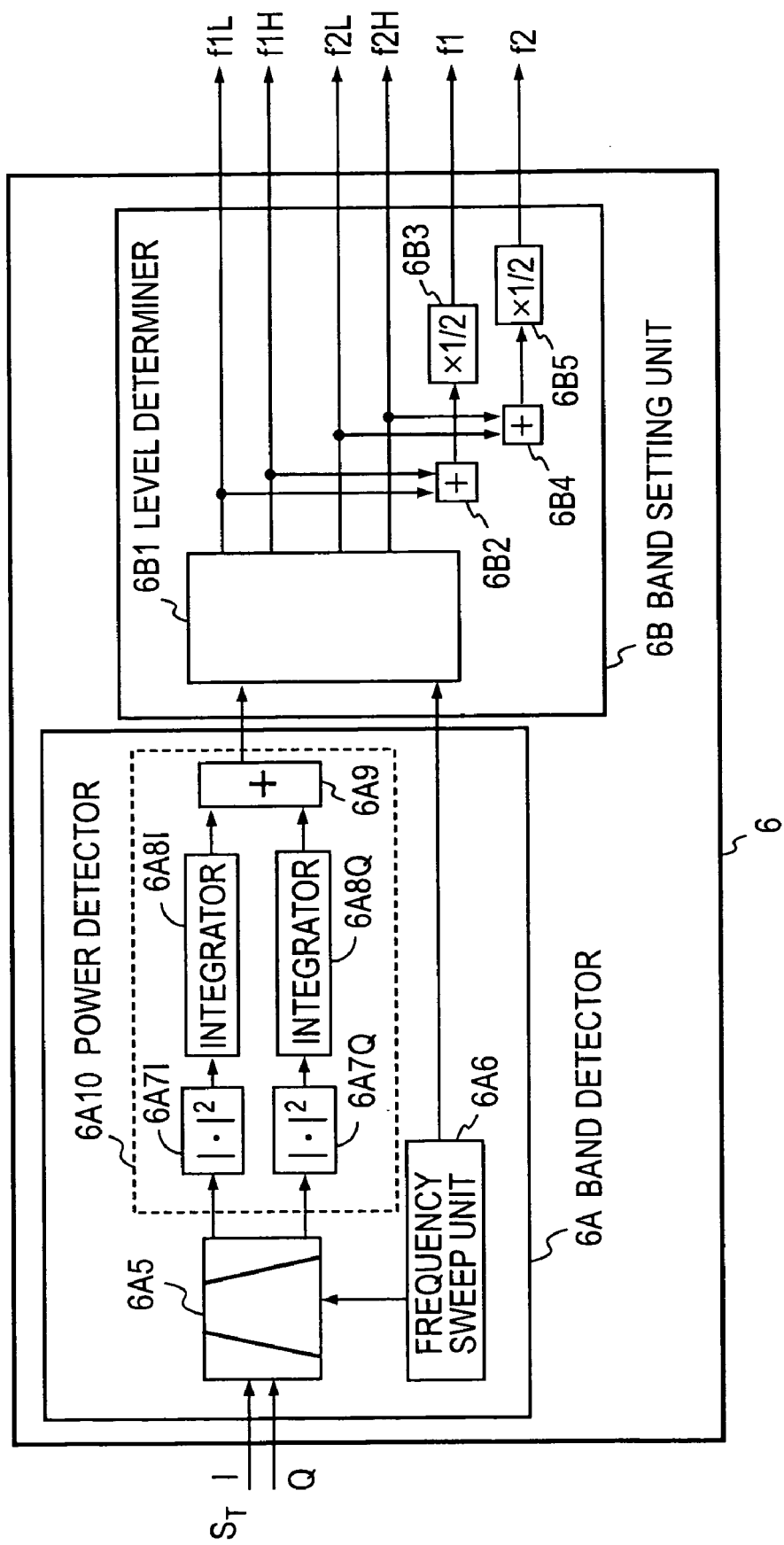
FIG. 13 is a diagram showing another example of a configuration of a frequency band controller.

FIG. 13 shows another example of the frequency band controller 6 in the embodiment shown in FIG. 8. In the embodiment, the band detector 6A consists of a variable filter 6A5, a frequency sweeper 6A6, squarers 6A7I and 6A7Q, integrators 6A8I and 6A8Q, and an adder 6A9. The squarers 6A7I and 6A7Q, the integrators 6A8I and 6A8Q and the adder 6A9 together constitute a power detector 6A10. The band setting unit 6B consists of a level determiner 6B1, adders 6B2 and 6B4 and ½ multipliers 6B3 and 6B5.

Figure 14A:
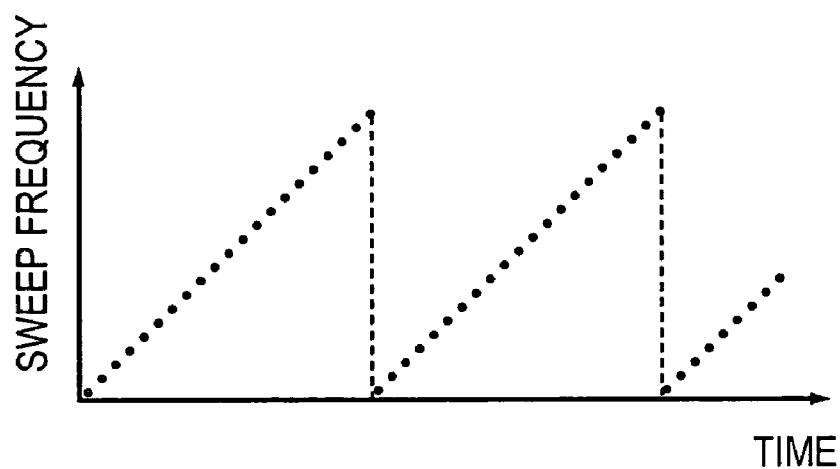
FIG. 14A is a diagram for illustrating a discrete frequency sweep.
Figure 14B:
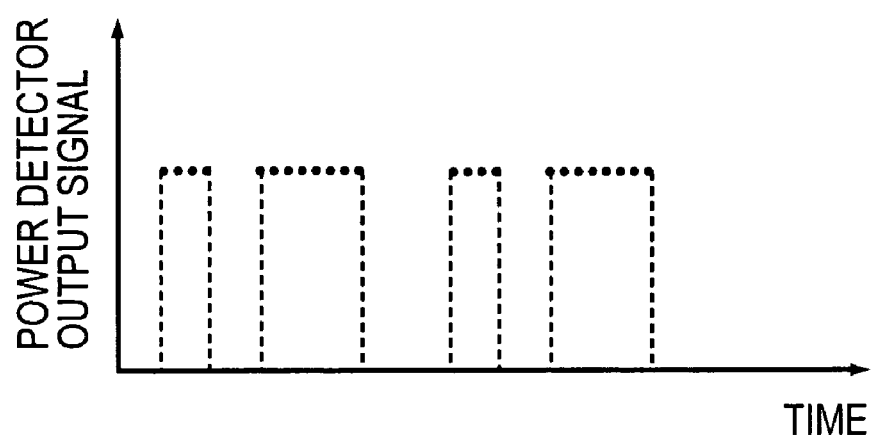
FIG. 14B is a diagram showing an output example of a power detector.

Frequency components of a narrow band are extracted from the digital input transmitting signal $S_T$ from the divider 4 (FIG. 8) by using the variable filter 6A5. The center frequency of the narrow pass band of the variable filter 6A5 is discretely swept as shown in FIG. 14A by frequency sweep signals generated at the frequency sweeper 6A6. Outputs from the variable filter 6A5 are I signal and Q signal, and their absolute values are squared at the square devices 6A7I and 6A7Q respectively. If the center frequency of the variable filter 6A5 is fixed, the integrators 6A8I and 6A8Q calculate a time average in the frequency. If the center frequency of the variable filter 6A5 is swept, a movement average is calculated. Either of the methods mentioned above is executed to average fluctuation of outputs from the variable filter 6A5. Outputs from the integrators 6A8I and 6A8Q are added at the adder 6A9. The result of the addition is provided for the level determiner 6B1 as a detected power from the power detector 6A10, as shown in FIG. 14B.

The level determiner 6B1 makes a reference to a discrete frequency represented by frequency sweep signals from the frequency sweep unit 6A6, and detects the frequencies at which the detected powers are equal to or greater than the threshold $V_{th}$, as a lower frequency and an upper frequency of each of the signal frequency bands FB1 and FB2. In such a case, the frequencies whose results of comparison to the threshold are reverse to each other are determined as the lower frequency or the upper frequency, as the frequencies are discretely swept.

The variable filter 6A5 of the band detector 6A is a digital filter. The pass-bandwidth and the center frequency are determined by coefficients of the digital filter. The variable filter 6A5 sets the pass-bandwidth and the center frequency by using a previously calculated coefficients list according to outputs from the frequency sweep unit 6A6. The pass-bandwidth is set so as to be narrow enough in comparison to the bandwidth of the input transmitting signal $S_T$. If a bandwidth of a base band transmitting signal $S_T$ is 15 MHz, for example, the pass-bandwidth of the variable filter 6A5 is set around 1 kHz. The frequency sweep unit 6A6 may be adapted to keep the values of the discrete sweep frequencies of one cycle in a shift register, for example, and cause a frequency outputted by cyclically shifting the frequency values. Alternatively, the frequency sweep unit 6A6 may be adapted to store the values of the discrete sweep frequencies of one cycle in a ROM and repeatedly read out a series of frequency values. The integrators 6A8I and 6A8Q may consist of FIR filters, for example. Alternatively, the integrators 6A8I and 6A8Q may be adapted to store the data outputted from the squarers 6A7I, 6A7Q in a RAM and obtain simple averages.

Although the fourth to sixth embodiments mentioned above describe the cases where the input signal $S_T$ of the digital predistorter 100 is divided to the frequency band controller 6 at the divider 4 and the signal frequency bands FB1 and FB2 included in the input signal $S_T$ are detected, it is apparent that input signals of the distortion detector 17 obtained from the output of the power amplifier 24 may be partly divided and supplied to the frequency band controller 6 and signal frequency bands FB1 and FB2 may be detected from the divided signals.

The multi-band power series type predistorter according to the present invention can be used at a base station of a mobile communication that transmits signals in a plurality of frequency bands.

What is claimed is:

1. A power series type predistorter for multi-frequency bands, comprising:
   a linear transmission path consisting of a delay element for delaying input signals;
   N distortion generating paths, N being an integer equal to or greater than 2;
   dividing means for dividing the input signals to said linear transmission path and said N distortion generating paths;
   N variable band signal extractors each inserted in corresponding one of said N distortion generating paths, for extracting signals in N different frequency bands from said input signals;
   N distortion generators each inserted in corresponding one of said N distortion generating paths, for generating distortion components of a predetermined odd order of said signals in said N frequency bands;
   combining means for combining an output from said linear transmission path and outputs from said N distortion generating paths and outputting a result of combining from the predistorter; and
   a frequency band controller for controlling frequency bands of said N variable band signal extractors.

2. The predistorter according to claim 1, further comprising:
   N vector adjustors each inserted in corresponding one of said N distortion generating paths, for adjusting phase and amplitude of distortion component of said predetermined odd order of each of the signals of said N frequency bands.

3. The predistorter according to claim 2, wherein
   each of said N distortion generating paths comprises at least another distortion generator for generating at least another order, different from said predetermined order, of distortion component of a signal in a corresponding one of said N frequency bands, at least another vector adjustor for adjusting phase and amplitude of said another order of distortion component of the signal in said corresponding one of said N frequency bands, and at least another vector combiner for combining an output from said vector adjustor and an output from said another vector adjustor and making it as the output from corresponding one of said N distortion generating paths.

4. The predistorter according to claim 1, wherein each of said N variable band signal extractors consists of band-pass filters.

5. The predistorter according to claim 1, wherein each of said N variable band signal extractors consists of band elimination filters.

6. The predistorter according to claim 1, wherein a center frequency of each of said N variable band signal extractors is controlled by said frequency band controller.

7. The predistorter according to claim 1, wherein a bandwidth of each of said N variable band signal extractors is controlled by said frequency band controller.

8. The predistorter according to claim 1, wherein said frequency band controller comprises a band detector for detecting the signals of said N frequency bands from said transmitting signal and a band setting unit for controlling said N variable band signal extractors based on the detected signals of said N frequency bands.

9. The predistorter according to claim 8, wherein said band detector comprises:
   a sweep signal generator for generating a sweep signal;
   a local signal generator for generating a local signal whose frequency is swept according to said sweep signal;
   a mixer for multiplying said local signal by said input transmitting signal; and
   a low-pass filter for extracting a direct current component from an output from said mixer and outputting it as a band detecting signal; and
   wherein said band setting unit determines a lower frequency, an upper frequency and a center frequency of each of the N frequency bands from said band detecting signal with reference to said sweep signal and sets them to corresponding one of said N variable signals extractors.

10. The predistorter according to claim 8, wherein said band detector comprises frequency domain converting means for converting said transmitting signal into a frequency domain signal and detecting the signals of said N frequency bands, and wherein
   said band setting unit comprises a level comparator for comparing levels of the detected signals of said N frequency bands with a threshold and determining a lower frequency and an upper frequency of each frequency band and means for determining an average of the lower frequency and the upper frequency of each of said frequency bands from the frequencies as the center frequency.

11. The predistorter according to claim 8, wherein
   said band detector comprises:
   a frequency sweep signal generator for generating a frequency sweep signal;
   a variable filter for sweeping the center frequency by said frequency sweep signal and extracting a frequency component at each of the sweep frequency from said transmitting signal; and
   a power detector for detecting a power of said frequency component; and wherein
   said band setting unit comprises:
   a level comparator for comparing the power of said detected frequency component with a threshold and determining a lower frequency and an upper frequency of each frequency band; and
   means for determining an average of the lower frequency and the upper frequency of each of said frequency bands from the frequencies as the center frequency.

* * * * *